(12) United States Patent
Fukushima et al.

(10) Patent No.: US 10,297,482 B2
(45) Date of Patent: May 21, 2019

(54) END EFFECTOR AND SUBSTRATE CONVEYING ROBOT

(71) Applicant: KAWASAKI JUKOGYO KABUSHIKI KAISHA, Kobe-shi, Hyogo (JP)

(72) Inventors: Takayuki Fukushima, Takarazuka (JP); Daiki Miyagawa, Akashi (JP)

(73) Assignee: KAWASAKI JUKOGYO KABUSHIKI KAISHA, Kobe-Shi (JP)

( * ) Notice: Subject to any disclaimer, the term of this patent is extended or adjusted under 35 U.S.C. 154(b) by 334 days.

(21) Appl. No.: 15/108,417

(22) PCT Filed: Dec. 19, 2014

(86) PCT No.: PCT/JP2014/083713
§ 371 (c)(1),
(2) Date: Jun. 27, 2016

(87) PCT Pub. No.: WO2015/098752
PCT Pub. Date: Jul. 2, 2015

(65) Prior Publication Data
US 2016/0322247 A1 Nov. 3, 2016

(30) Foreign Application Priority Data
Dec. 26, 2013 (JP) .................. 2013-270275

(51) Int. Cl.
*H01L 21/677* (2006.01)
*H01L 21/687* (2006.01)

(52) U.S. Cl.
CPC .. *H01L 21/67781* (2013.01); *H01L 21/67766* (2013.01); *H01L 21/68707* (2013.01)

(58) Field of Classification Search
CPC ........ B25J 9/042; B25J 9/106; B25J 11/0095; B25J 15/0052; B25J 15/0057;
(Continued)

(56) References Cited

U.S. PATENT DOCUMENTS

| 6,132,160 A | 10/2000 | Iwai |
| 9,343,341 B2 | 5/2016 | Hashimoto et al. |

(Continued)

FOREIGN PATENT DOCUMENTS

| JP | 2006-313865 A | 11/2006 |
| JP | 2013-062352 A | 4/2013 |

(Continued)

OTHER PUBLICATIONS

Mar. 10, 2015 International Search Report issued in International Patent Application No. PCT/JP2014/083713.

(Continued)

*Primary Examiner* — Saul Rodriguez
*Assistant Examiner* — Brendan P Tighe
(74) *Attorney, Agent, or Firm* — Oliff PLC

(57) ABSTRACT

An end effector has a plurality of blade bodies and a substrate holding unit on a blade proximal end side of each of the blade bodies. The substrate holding unit includes a substrate placing portion on which the bottom surface edge portion of the substrate is placed and a substrate abutting portion which extends upward from the blade proximal end side of the substrate placing portion and on which the side end portion of the substrate abuts. The height of the substrate abutting portion is set to keep the substrate from entering between an upper end of the substrate abutting portion of the blade body on a lower side and the bottom surface of the blade body on an upper side. In an end effector having a plurality of blades capable of changing in pitch in the vertical direction, substrates mounted in high density can be held without a problem.

9 Claims, 13 Drawing Sheets

(58) Field of Classification Search
CPC ......... H01L 21/67742; H01L 21/67766; H01L 21/67781; H01L 21/68707; H01L 21/68771; Y10S 414/137; Y10S 414/141
USPC .................. 248/242; 414/268, 273, 744.5
See application file for complete search history.

(56) References Cited

U.S. PATENT DOCUMENTS

| | | | |
|---|---|---|---|
| 2001/0048867 A1* | 12/2001 | Lebar | ............... C23C 16/4583 414/217 |
| 2004/0179932 A1 | 9/2004 | Sandhu et al. | |
| 2008/0267747 A1 | 10/2008 | DiBella et al. | |
| 2010/0290886 A1 | 11/2010 | Hashimoto et al. | |
| 2013/0062013 A1 | 3/2013 | Okada et al. | |

FOREIGN PATENT DOCUMENTS

| | | | |
|---|---|---|---|
| WO | 2010/103876 A1 | 9/2010 | |
| WO | 2013/021645 A1 | 2/2013 | |

OTHER PUBLICATIONS

Jun. 28, 2016 International Preliminary Report on Patentability issued in International Patent Application No. PCT/JP2014/083713.
Jul. 5, 2017 Search Report issued in European Patent Application No. 14873503.8.

* cited by examiner

END EFFECTOR AND SUBSTRATE CONVEYING ROBOT

TECHNICAL FIELD

The present invention relates to an end effector and a substrate conveying robot comprising the same end effector, particularly to a substrate conveying robot comprising an end effector including a plurality of blades capable of changing in pitch in the vertical direction between a minimum pitch and a maximum pitch and a substrate conveying robot comprising the same end effector.

BACKGROUND ART

Conventionally, a substrate conveying robot comprising an end effector having a plurality of blades each of which holds a wafer (substrate) and a function of converting their pitch in the vertical direction is known. By this type of end effector, a plurality of wafers stored in a cassette or the like can be held at the same time so as to be conveyed.

Note that, as illustrated in FIG. 20, a plurality of wafers W in a cassette C are sometimes placed in the cassette C varying in the front-rear direction. Namely, not all the wafers W is positioned in a deepest position D, some wafers W are displaced forward from the wafer deepest position D.

Therefore, when a plurality of wafers W are held by the conventional end effector at the same time, the wafers W are once received by their respective wafer receiving portions R provided on blades B as illustrated in FIG. 21, and after that, the wafers W are pressed in one direction by a plunger (not illustrated) so as to be positioned (Patent Document 1).

Types of plungers include a type of pressing the wafers W by the plunger itself provided separately from the wafer receiving portions R, a type of pressing by the plunger the wafer receiving portions R on which their respective wafers W are placed, and the like. Anyway, in the conventional end effector, the plunger is necessary to position the wafers W.

However, using the plunger causes a problem such as the generation of particles, and even when the plunger cannot be used, it is required that the wafers can be positioned as if the plunger is used.

Also, as illustrated in FIG. 21, the height of the wafer receiving portion R is set to a substantially low height compared to the pitch between the blades B in the conventional end effector.

Note that, as the dimensions of the cassette C itself and a cassette placing table have actual article errors, the heights of the wafers W may be different between each cassette C. Therefore, the advancing height of the end effector has to be taught for each cassette C.

However, since the height of the wafer receiving portion R of the conventional end effector is relatively low as illustrated in FIG. 21, there is a problem that an allowable setting range in teaching the advancing height of the end effector is small and burden on the teaching operation is large.

CITATION LIST

Patent Literature

[PTL 1] Japanese Patent Application Laid-Open No. 2006-313865

SUMMARY OF INVENTION

Technical Problem

The present invention is made considering the problems of the above-stated conventional technology, and an object thereof is that, in an end effector comprising a plurality of blades capable of changing in pitch in the vertical direction between the minimum pitch and the maximum pitch, substrates mounted in high density can be held without a problem.

Solution to Problem

In order to achieve the above-mentioned objects, the present invention comprises, in an end effector having a plurality of blades capable of changing in pitch in a vertical direction between a minimum pitch and a maximum pitch, a plurality of blade bodies, and a substrate holding unit provided on a blade proximal end side of each of the plurality of blade bodies, wherein the substrate holding unit includes a substrate placing portion on which a bottom surface edge portion of the substrate is placed and a substrate abutting portion which extends upward from the blade proximal end side of the substrate placing portion and on which a side end portion of the substrate abuts, a height of the substrate abutting portion being set so as to keep the substrate from entering between an upper end of the substrate abutting portion of the blade body on a lower side and a bottom surface of the blade body on an upper side.

Also, it is preferable that the substrate abutting portion extends uprightly from the substrate placing portion.

Also, it is preferable that the substrate abutting portion extends from the substrate placing portion so as to be inclined toward the blade proximal end side.

Also, it is preferable that a receiving opening into which the substrate abutting portion of the blade body on the lower side can enter is formed in the blade body on the upper side.

Also, it is preferable that at least a part of the substrate abutting portion of the blade body on the lower side enters into the receiving opening of the blade body on the upper side in the minimum pitch.

Also, it is preferable that the substrate abutting portion of the blade body on the lower side has a height at least equal to a height of the receiving opening of the blade body on the upper side in the minimum pitch.

Also, it is preferable that the plurality of receiving openings formed in the plurality of blade bodies are overlapped with each other in a view from the vertical direction.

Also, it is preferable that the plurality of receiving openings formed in the plurality of blade bodies are not overlapped with each other in a view from the vertical direction.

Also, it is preferable that the substrate abutting portion of the blade body on the lower side and the receiving opening formed in the blade body on the upper side are at least partially overlapped with each other in a view from the vertical direction.

In order to achieve the above-mentioned objects, the substrate conveying robot according to the present invention comprises any one of the end effectors above and an articulated arm on whose distal end the end effector is mounted.

Note that the "upper/upward (upper side)" and the "lower (lower side)" herein refer to, in the direction orthogonal to the top surface of a substrate held by an end effector, the top surface side of the substrate and the bottom surface side of the substrate, respectively.

Advantageous Effect of Invention

According to the invention, in an end effector comprising a plurality of blades capable of changing in pitch in the vertical direction between the minimum pitch and the maximum pitch, substrates mounted in high density can be held without a problem.

DESCRIPTION OF EMBODIMENTS

Hereunder, an end effector according to an embodiment of the present invention and a substrate conveying robot comprising the same end effector will be described referring to the figures. The substrate to be conveyed by the substrate conveying robot according to the embodiment is typically a disk-shaped wafer.

Figure 1:
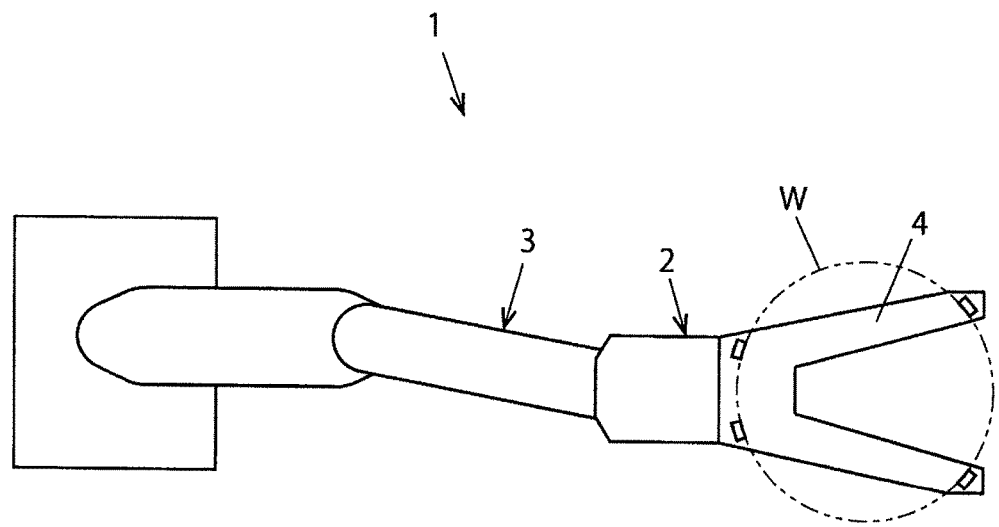
FIG. 1 is a plan view illustrating a substrate conveying robot comprising an end effector according to an embodiment of the present invention.
Figure 2:
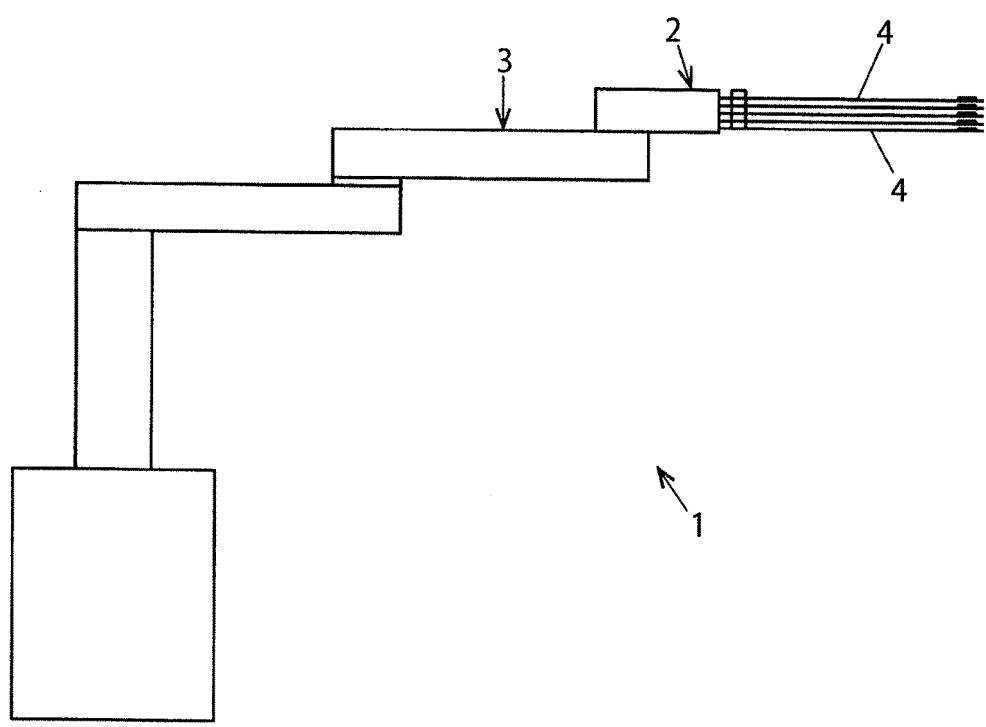
FIG. 2 is a side view illustrating the substrate conveying robot in FIG. 1.

As illustrated in FIGS. 1 and 2, the substrate conveying robot 1 according to the embodiment comprises an end effector 2, and an articulated arm 3 on whose distal end the end effector 2 is mounted. The end effector 2 comprises a plurality of blades 4 capable of changing in pitch in the vertical direction between the minimum pitch and the maximum pitch.

Figure 3:
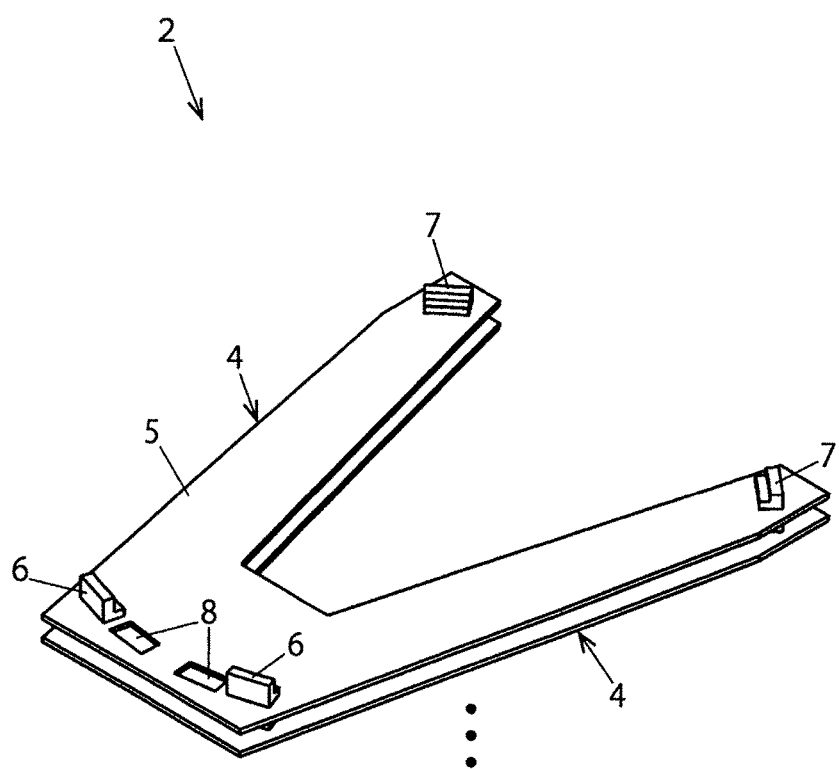
FIG. 3 is a perspective view illustrating the end effector of the substrate conveying robot in FIG. 1.

As illustrated in FIG. 3, each of the blades 4 of the end effector 2 comprises a blade body 5, a plurality of (two in the example) substrate holding unit 6 provided on each blade proximal end side of the blade body 5, and a plurality of (two in the example) substrate receiving portions 7 provided on the blade distal end side. Also, a receiving opening 8 which penetrates the blade body 5 is formed beside each substrate holding unit 6.

Hereunder, the substrate holding unit 6 provided on the blade proximal end side as one of the characteristics of the present invention will be described referring to FIG. 4.

Figure 4:
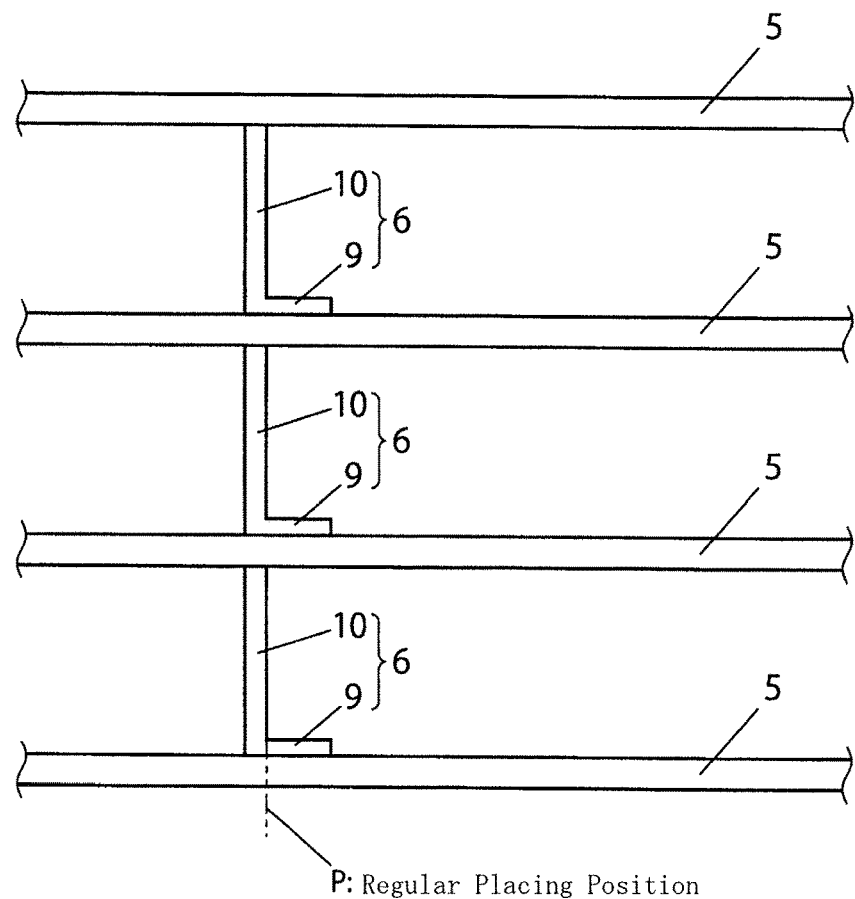
FIG. 4 is an enlarged schematic view illustrating the substrate holding unit of the end effector in FIG. 3.

As illustrated in FIG. 4, the substrate holding unit 6 provided on the blade proximal end side has a substrate placing portion 9 on which a bottom surface edge portion of a wafer (substrate) W is placed and a substrate abutting portion 10 uprightly extending upward from the blade proximal end side of the substrate placing portion 9.

Additionally, in the end effector 2 according to the embodiment, the height of the substrate abutting portion 10 is set so as to keep the wafer W from entering between the upper end of the substrate abutting portion 10 of the blade body 5 on the lower side and the bottom surface of the blade body 5 on the upper side.

Figure 5A:
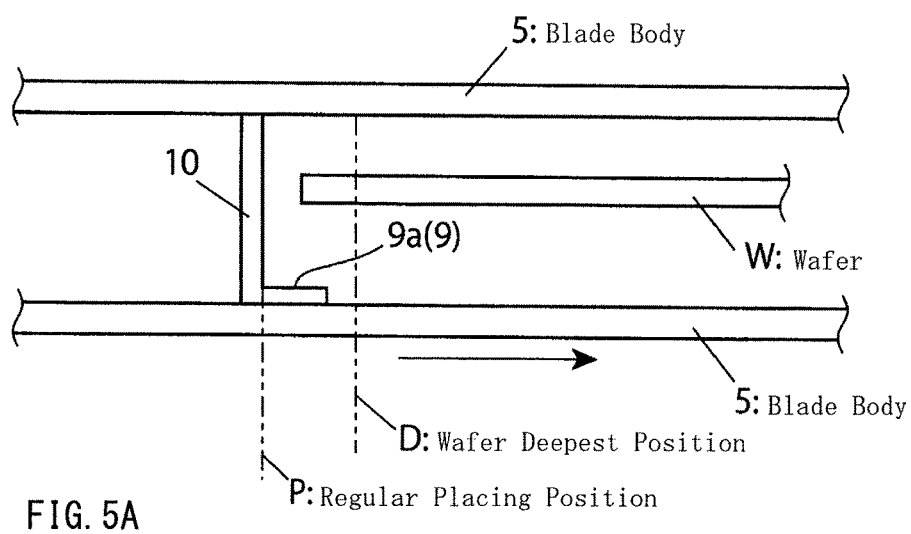
FIG. 5A is a schematic view illustrating an operation of holding a wafer by the end effector in FIG. 3.
Figure 5B:
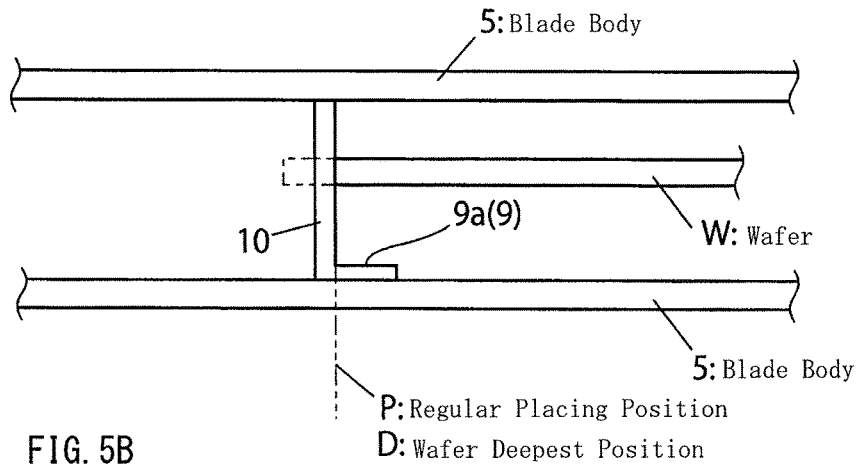
FIG. 5B is another schematic view illustrating the operation of holding the wafer by the end effector in FIG. 3.
Figure 5C:
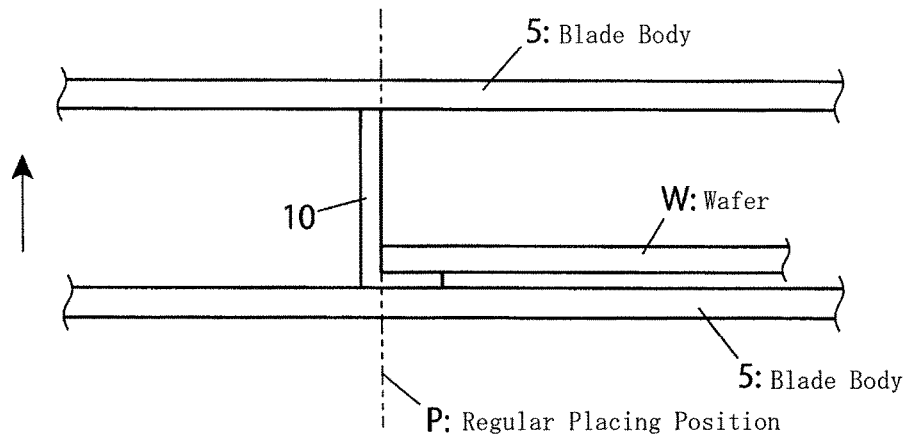
FIG. 5C is another schematic view illustrating the operation of holding the wafer by the end effector in FIG. 3.

Next, an operation of holding a plurality of wafers W loaded in a cassette by the end effector 2 according to the embodiment will be described referring to FIG. 5A to FIG. 5C.

(1) The end effector 2 is positioned in front of the cassette.

(2) The height of the end effector 2 is positioned a little lower than the height of the shelf of the cassette. Specifically, substrate placing surfaces 9a of the substrate placing portions 9 of the substrate holding unit 6 are positioned lower than the bottom surfaces of the corresponding wafers W in the cassette.

(3) The end effector 2 is advanced from the state (FIG. 5A) and moved as far as a position where the wafer W in a cassette deepest position D can be positioned in the regular position. Namely, the end effector 2 is advanced until a regular placing position P of the end effector 2 comes to the wafer deepest position D (FIG. 5B).

At this time, all the wafers W which have been displaced more forward than the wafer deepest position D are pressed by the substrate abutting portion 10 of the substrate holding unit 6. Thereby, all the wafers W are aligned in the wafer deepest position D.

(4) Subsequently, the end effector 2 is raised. Thereby, the wafers W are lowered relatively and placed on the substrate placing surfaces 9a of the corresponding substrate placing portions 9 in the aligned position (FIG. 5C). At this time, the side edge portions of the wafers W in the state of being placed on the substrate placing surfaces 9a of the corresponding substrate placing portions 9 abuts just on the corresponding substrate abutting portions 10.

(5) the end effector 2 is retracted from the cassette, in the state of holding a plurality of wafers W in this manner.

As the height of the substrate abutting portion 10 is set so as to keep the wafer W from entering between the upper end of the substrate abutting portion 10 of the blade body 5 on the lower side and the bottom surface of the blade body 5 on the upper side in the end effector 2 according to the embodiment, the wafer W can be prevented from getting over the substrate abutting portion 10 when the end effector 2 is operated back and forth.

Therefore, the substrate holding unit 6 can be used without a problem as a unit for aligning the wafers W when taking a plurality of wafers W out from the cassette. Namely, while the height of the wafer receiving portion of the conventional end effector is set relatively low and therefore there is a possibility that the wafer might get over the upper end of the wafer receiving portion when the wafer receiving portion is used for aligning the wafers, the problem is solved in the embodiment.

Also, since the height of the substrate abutting portion 10 is set higher in the embodiment than the conventional case as stated above, the allowable setting range in teaching the advancing height of the end effector 2 is large and therefore the burden on the teaching operation can be reduced.

Next, the end effector 2 according to another embodiment of the present invention will be described referring to FIGS. 6, 7A, and 7B.

Figure 6:
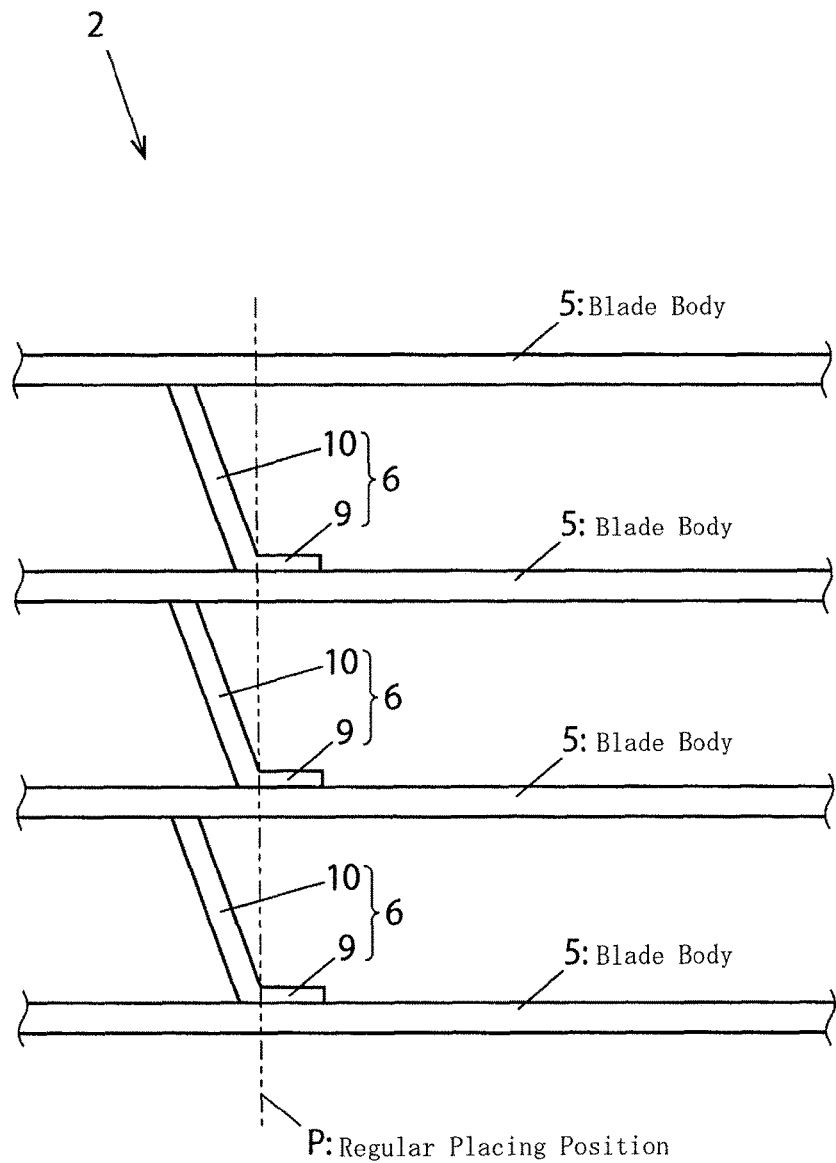
FIG. 6 is an enlarged schematic view illustrating a substrate holding unit of an end effector according to another embodiment of the present invention.

As illustrated in FIG. 6, in the end effector 2 according to the embodiment, the substrate abutting portion 10 of the substrate holding unit 6 extends from the substrate placing portion 9 so as to be inclined toward the blade proximal end side.

Also in the embodiment, the height of the substrate abutting portion 10 is set so as to keep the wafer W from entering between the upper end of the substrate abutting portion 10 of the blade body 5 on the lower side and the bottom surface of the blade body 5 on the upper side.

Figure 7A:
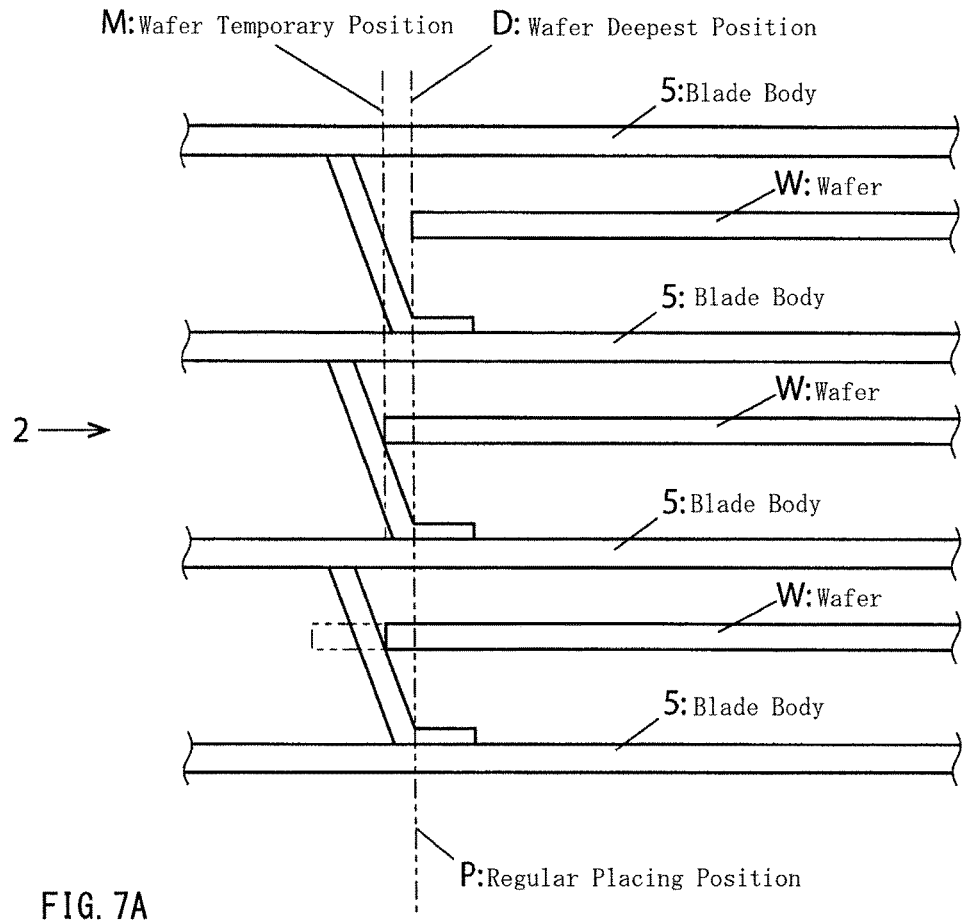
FIG. 7A is a schematic view illustrating an operation of holding a wafer by the end effector in FIG. 6.

When holding a plurality of wafers W in the cassette by the end effector 2 according to the embodiment, the end effector 2 is advanced straight until the regular placing position P of the end effector 2 comes to the wafer deepest position D as illustrated in FIG. 7A.

At this time, the wafer W which has been displaced more forward than a temporary position M abutting on the substrate abutting portion 10 is pressed in as far as the temporary position M by the substrate abutting portion 10. Namely, all the wafers W which have been displaced more forward than the temporary position M are aligned in the temporary position M. Note that the wafer W which has been positioned more backward than the temporary position M stays in the position.

Figure 7B:
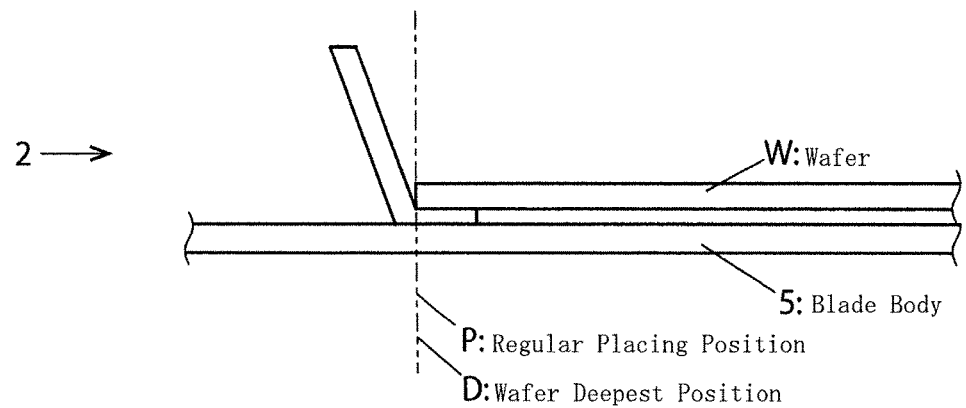
FIG. 7B is another schematic view illustrating the operation of holding the wafer by the end effector in FIG. 6.

When the end effector 2 is raised from the state illustrated in FIG. 7A, all the wafers W in the temporary position M are aligned in the regular placing position P as illustrated in FIG. 7B by their reapective drop-in of sliding down on the corresponding substrate abutting portions 10.

Also in the end effector 2 according to the embodiment, the wafer W can be prevented from getting over the substrate abutting portion 10 when the end effector 2 is operated back and forth. Also, the allowable setting range in teaching the advancing height of the end effector 2 is large and therefore the burden on the teaching operation can be reduced.

In addition, as the substrate abutting portion 10 of the substrate holding unit 6 is inclined toward the blade proximal end side, the allowable setting range in teaching the advancing height of the end effector 2 is larger and therefore the burden on the teaching operation can be further reduced.

In the end effector according to each embodiment above, receiving openings 7 into which the corresponding substrate abutting portions 10 of the blade body 5 on the lower side can enter is formed in the blade body 5 on the upper side.

Figure 8:
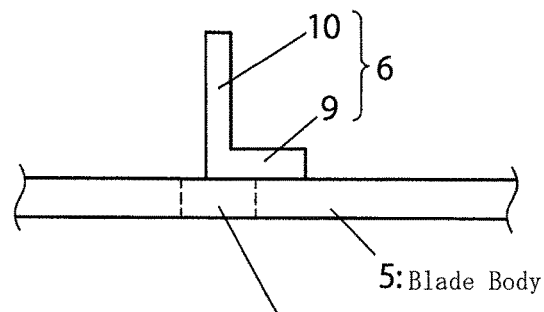
FIG. 8 is an enlarged side view illustrating the substrate holding unit of the end effector in FIG. 3.
Figure 9A:
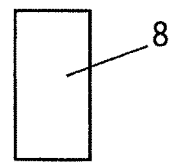
FIG. 9A is an enlarged plan view illustrating the substrate holding unit of the blade on the upper side of the end effector in FIG. 3.
Figure 9A:
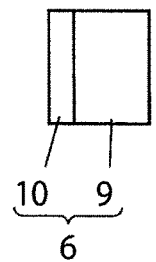
Figure 9B:
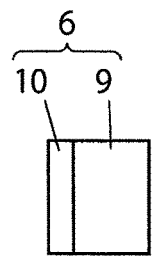
FIG. 9B is an enlarged plan view illustrating the substrate holding unit of the blade on the lower side of the end effector in FIG. 3.
Figure 9B:
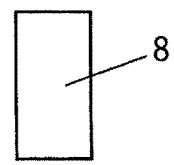
Figure 10:
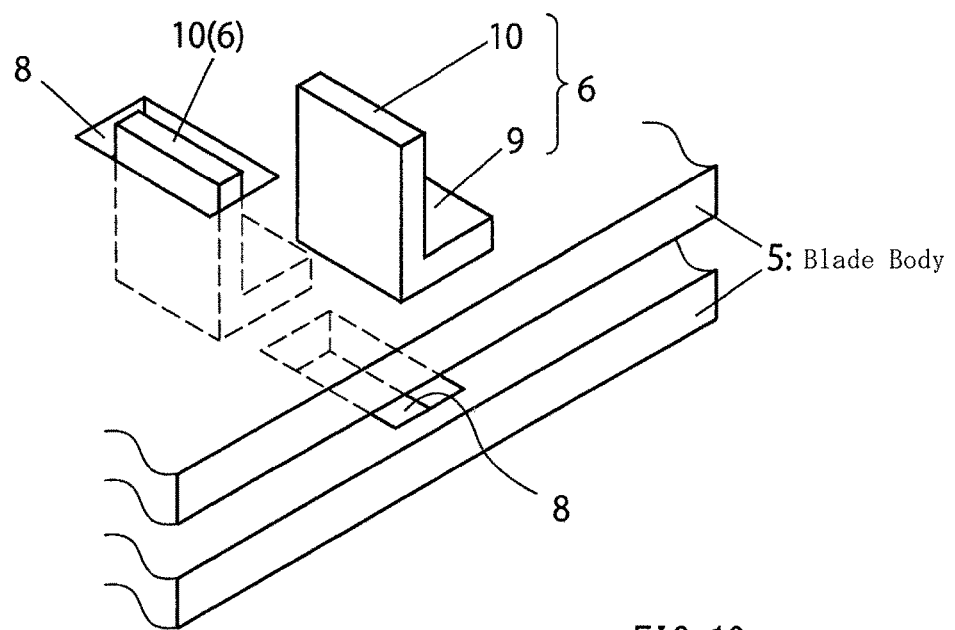
FIG. 10 is an enlarged perspective view illustrating the substrate holding unit of the upper and lower blades of the end effector in FIG. 3.

Namely, in the embodiment illustrated in FIG. 4 (structure that the substrate abutting portions 10 are upright), a receiving opening 8 is formed beside each substrate holding unit 6 as illustrated in FIGS. 8 to 10. As illustrated in FIGS. 9A and 9B, the arrangement of the substrate holding unit 6 and receiving opening 8 is reversed between the blade body 5 on the upper side (FIG. 9A) and the blade body 5 on the lower side (FIG. 9B). Namely, the arrangement of the substrate holding unit 6 and receiving opening 8 is changed for each blade body 5 in the vertical direction of a plurality of blade bodies 5.

In the example, a plurality of receiving openings 8 formed in a plurality of blade bodies 5 are not overlapped with each other in a view from the vertical direction. In contrast, the substrate abutting portion 10 of the blade body 5 on the lower side and the receiving opening 10 formed in the blade body 5 on the upper side are overlapped at least partially in a view from the vertical direction.

Figure 11:
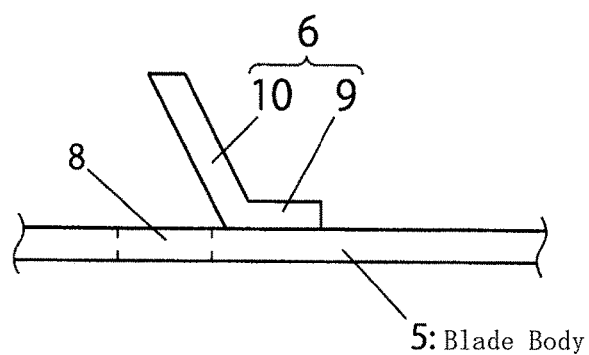
FIG. 11 is an enlarged side view illustrating the substrate holding unit of the end effector in FIG. 6.
Figure 12A:
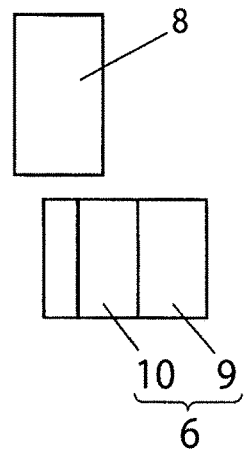
FIG. 12A is an enlarged plan view illustrating the substrate holding unit of the blade on the upper side of the end effector in FIG. 6.
Figure 12B:
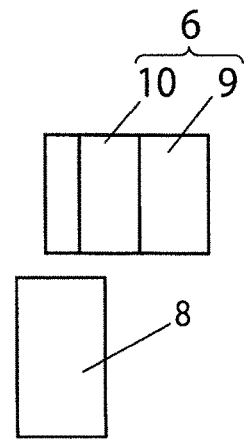
FIG. 12B is an enlarged plan view illustrating the substrate holding unit of the blade on the lower side of the end effector in FIG. 6.

Similarly, also in the embodiment illustrated in FIG. 6 (structure that the substrate abutting portions 10 are inclined), the receiving opening 8 is formed beside each substrate holding unit 6 and also the arrangement of the substrate holding unit 6 and receiving opening 8 is changed for each blade body 5, as illustrated in FIGS. 11, 12A, and 12B.

In each embodiment above, by forming the receiving opening 8 into which the substrate abutting portion 10 of the lower blade body 5 can enter in the blade body 5 on the upper side, the substrate abutting portion 10 of the blade body 5 on the lower side does not interfere with the bottom surface of the blade body 5 on the upper side even when the blade pitch is changed from the maximum pitch to the minimum pitch.

Accordingly, the blade pitch can be changed to the minimum pitch after taking the wafers W out from the cassette with a large pitch, and therefore the wafers W can be set in the cassette with a small pitch. Alternatively, in contrast, the wafers W taken out from the cassette with a small pitch can be set in the cassette with a large pitch as well.

Note that a length Ho of the receiving opening 8 in the end effector horizontal advancing direction can be represented as $$Ho \geq (Pb - Ps)/\tan \theta$$

provided that the maximum pitch distance is Pb, the minimum pitch distance is Ps, and the inclination angle of the substrate abutting portion 10 is $\theta$.

In each embodiment above, as at least a part of the substrate abutting portion 10 of the blade body 5 on the lower side enters into the receiving opening 8 of the blade body 5 on the upper side when the blade interval is minimum in pitch, the wafer W can be surely prevented from getting over the substrate abutting portion 10 in the minimum pitch.

Also, as the substrate abutting portion 10 of the blade body 5 on the lower side has at least the height of the receiving opening 8 of the blade body 5 on the upper side when the blade interval is maximum in pitch, the wafer W can be surely prevented from getting over the substrate abutting portion 10 also in the maximum pitch.

Figure 13:
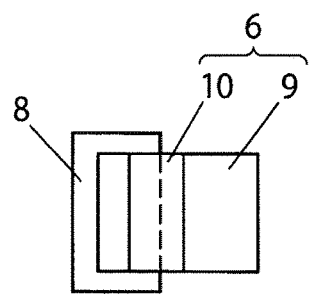
FIG. 13 is a plan view illustrating a variation of the substrate holding unit in FIGS. 11, 12A, and 12B.
Figure 14:
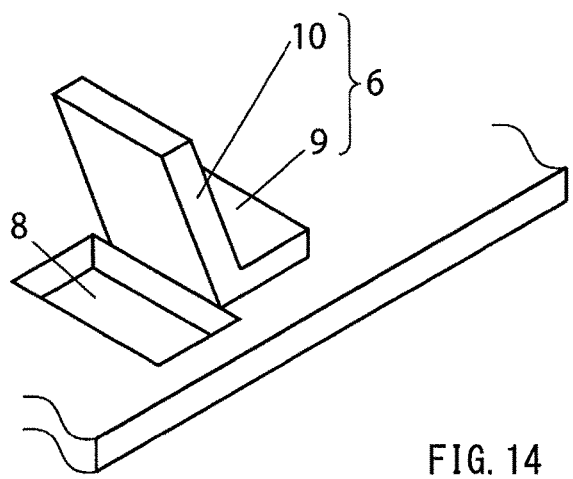
FIG. 14 is a perspective view of the substrate holding unit in FIG. 13.
Figure 15:
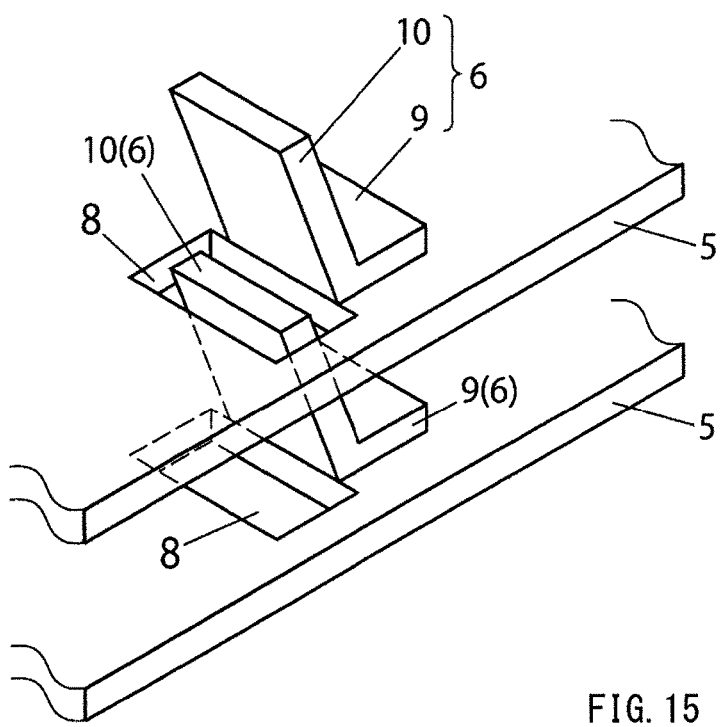
FIG. 15 is a perspective view illustrating the substrate holding unit in FIG. 13 and FIG. 14 together with blades with a large pitch.
Figure 16:
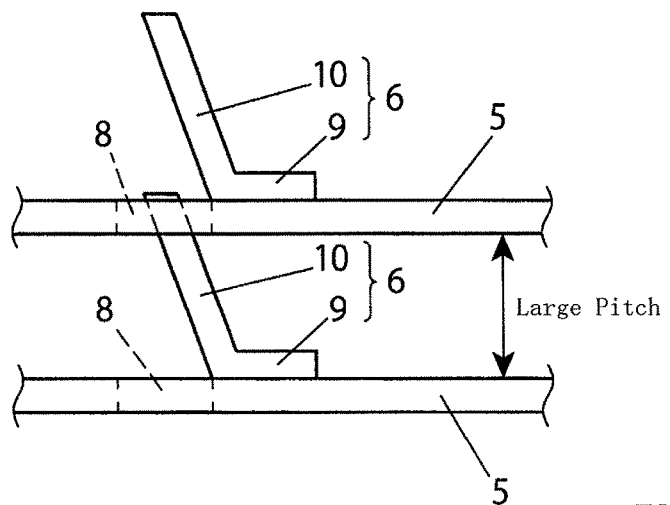
FIG. 16 is a side view illustrating the substrate holding unit and blade in FIG. 15.
Figure 17:
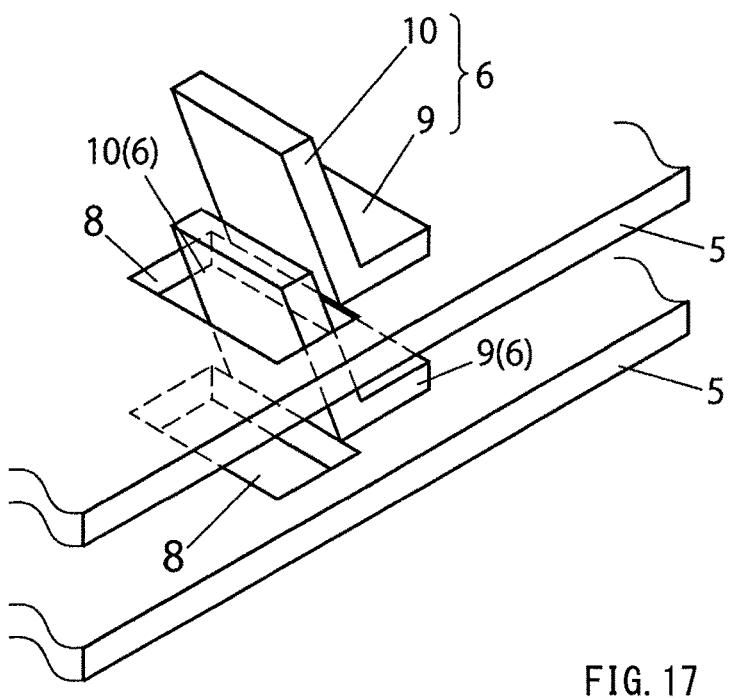
FIG. 17 is a perspective view illustrating the substrate holding unit in FIG. 13 and FIG. 14 together with blades with a small pitch.
Figure 18:
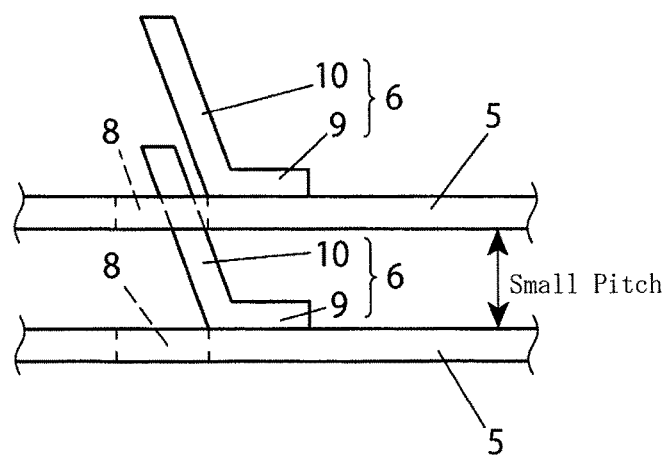
FIG. 18 is a side view of the substrate holding unit and blade in FIG. 17.

In the embodiment in FIG. 6, the receiving opening 8 may be formed adjacent to the rear of each substrate holding unit 6, as illustrated in FIGS. 13 and 14. In the case, a plurality of receiving openings 8 formed in a plurality of blade bodies 5 are overlapped with each other in a view from the vertical direction.

As illustrated in FIGS. 15 to 18, in this example, whether the blade pitch is the maximum pitch (FIGS. 15 and 16) or the minimum pitch (FIGS. 17 and 18), the wafer W can be surely prevented from getting over the substrate abutting portion 10.

In addition, since the arrangement of the substrate holding unit 6 and receiving opening 8 does not need to be inverted between the blade 4 on the upper side and blade 4 on the lower side, all of a plurality of blades 4 can have common construction and the manufacturing cost can be reduced.

Figure 19:
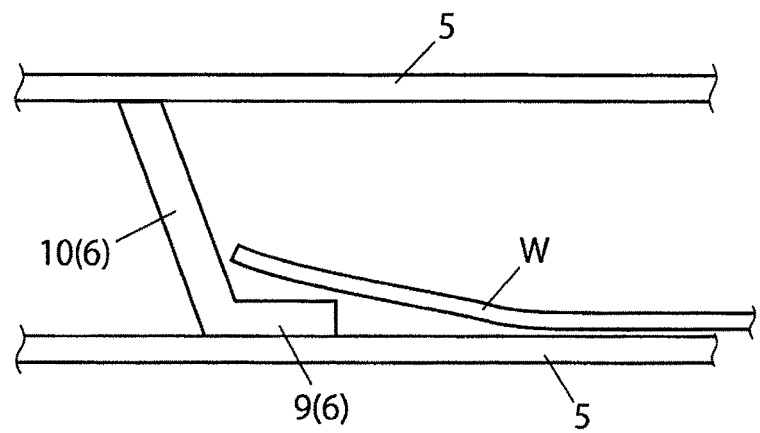
FIG. 19 is a schematic view illustrating the state that a warped wafer is held by the substrate holding unit in FIG. 6.
Figure 20:
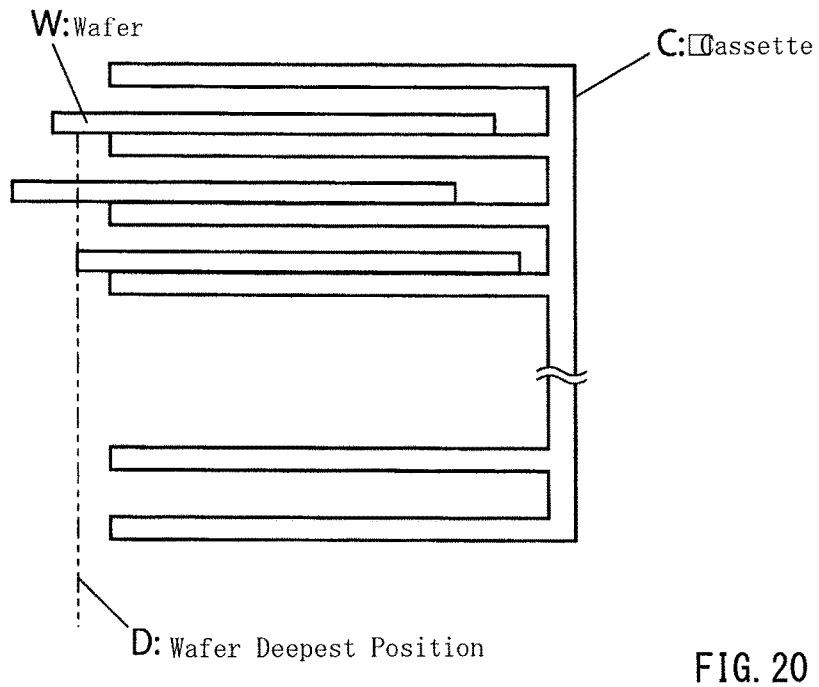
FIG. 20 is a schematic view illustrating the state that a plurality of wafers are stored in a cassette.
Figure 21:
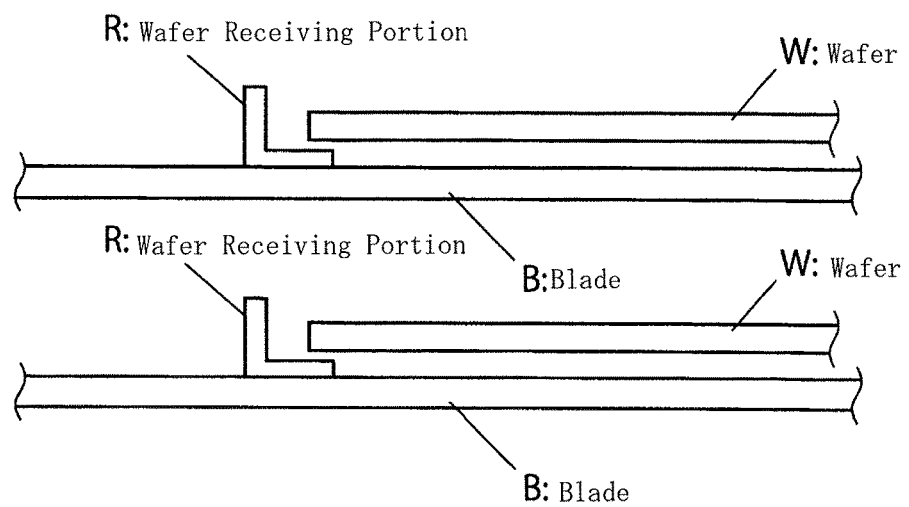
FIG. 21 is a schematic view illustrating an operation of holding a plurality of wafers at the same time by a conventional end effector.

As the height of the substrate abutting portion 10 of the substrate holding unit 6 is set relatively high in each embodiment above, the wafer W can be held in the regular position even when the wafer W is warped as illustrated in FIG. 19.

Also, the end effector 2 according to each embodiment above does not need a plunger which has been conventionally indispensable, however, it does not mean that an additional plunger is prevented from being attached thereto.

REFERENCE SIGNS LIST

1 . . . substrate conveying robot
2 . . . end effector
3 . . . articulated arm
4 . . . blade
5 . . . blade body
6 . . . substrate holding unit
7 . . . substrate receiving portion
8 . . . receiving opening
9 . . . substrate placing portion
9a . . . substrate placing surface
10 . . . substrate abutting portion
W . . . wafer

The invention claimed is:

1. An end effector having a plurality of blades capable of changing in pitch in a vertical direction between a minimum pitch and a maximum pitch, comprising:
   a plurality of blade bodies; and
   a substrate holding unit provided on a blade proximal end side of each of the plurality of blade bodies,
   wherein the substrate holding unit includes (i) a substrate placing portion on which a bottom surface edge portion of the substrate is placed and (ii) a substrate abutting portion which extends upward from the blade proximal end side of the substrate placing portion and on which a side end portion of the substrate abuts,
   a height of the substrate abutting portion being set so as to keep the substrate from entering between an upper end of the substrate abutting portion of the blade body on a lower side and a bottom surface of the blade body on an upper side, and
   a receiving opening into which the substrate abutting portion of the blade body on the lower side can enter is formed in the blade body on the upper side.

2. The end effector according to claim 1, wherein the substrate abutting portion extends uprightly from the substrate placing portion.

3. The end effector according to claim 1, wherein the substrate abutting portion extends from the substrate placing portion so as to be inclined toward the blade proximal end side.

4. The end effector according to claim 1, wherein at least a part of the substrate abutting portion of the blade body on the lower side enters into the receiving opening of the blade body on the upper side in the minimum pitch.

5. The end effector according to claim 4, wherein the substrate abutting portion of the blade body on the lower side has a height at least equal to a height of the receiving opening of the blade body on the upper side in the minimum pitch.

6. The end effector according to claim 1, wherein the plurality of receiving openings formed in the plurality of blade bodies are overlapped with each other in a view from the vertical direction.

7. The end effector according to claim 1, wherein the plurality of receiving openings formed in the plurality of blade bodies are not overlapped with each other in a view from the vertical direction.

8. The end effector according to claim 7, wherein the substrate abutting portion of the blade body on the lower side and the receiving opening formed in the blade body on the upper side are at least partially overlapped with each other in a view from the vertical direction.

9. A substrate conveying robot comprising the end effector according to claim 1 and an articulated arm on whose distal end the end effector is mounted.

* * * * *